(12) United States Patent  (10) Patent No.: US 8,217,701 B2
Kim  (45) Date of Patent: Jul. 10, 2012

(54) LEVEL SHIFTER

(75) Inventor: Yong-Hun Kim, Seoul (KR)

(73) Assignee: Samsung Electronics Co., Ltd., Suwon-Si (KE)

( * ) Notice: Subject to any disclaimer, the term of this patent is extended or adjusted under 35 U.S.C. 154(b) by 408 days.

(21) Appl. No.: 12/615,373

(22) Filed: Nov. 10, 2009

(65) Prior Publication Data

US 2010/0118022 A1  May 13, 2010

(30) Foreign Application Priority Data

Nov. 10, 2008 (KR) .............................. 2008-0111011

(51) Int. Cl.
*H03L 5/00* (2006.01)
(52) U.S. Cl. .......................................... 327/333; 326/68
(58) Field of Classification Search .................... 327/333
See application file for complete search history.

(56) References Cited

U.S. PATENT DOCUMENTS

| | | | | |
|---|---|---|---|---|
| 7,501,876 B2* | 3/2009 | Kimura | .......................... | 327/333 |
| 7,573,313 B2* | 8/2009 | Johansson et al. | ............. | 327/333 |
| 7,884,646 B1* | 2/2011 | Bourstein | ........................ | 326/81 |
| 7,952,415 B2* | 5/2011 | Shim | ............................. | 327/333 |

FOREIGN PATENT DOCUMENTS

| | | |
|---|---|---|
| JP | 08-237107 | 9/1996 |
| JP | 09-246945 | 9/1997 |
| KR | 10-1997-0707637 | 12/1997 |

* cited by examiner

*Primary Examiner* — Hai L Nguyen
(74) *Attorney, Agent, or Firm* — F. Chau & Associates, LLC

(57) ABSTRACT

A level shifter includes a first input circuit, a first load circuit, a second input circuit, and a second load circuit. The first input circuit receives a first input signal and a second input signal that swing between a first high power voltage and a first low power voltage. The first load circuit generates a high voltage, a sub-high voltage, a low voltage, and a sub-low voltage. The second input circuit receives a first voltage pair including the high voltage and the low voltage, and a second voltage pair including the sub-high voltage and the sub-low voltage. The second load circuit generates an output signal that swings between a second high power voltage and a second low power voltage.

20 Claims, 9 Drawing Sheets

LEVEL SHIFTER

CROSS-REFERENCE TO RELATED APPLICATION

This application claims priority under 35 USC §119 to Korean Patent Application No. 2008-0111011, filed on Nov. 10, 2008, in the Korean Intellectual Property Office (KIPO), the disclosure of which is incorporated by reference in its entirety herein.

BACKGROUND

1. Technical Field

Exemplary embodiments of the present invention relate to a semiconductor integrated circuit, and more particularly to a low power and high speed level shifter.

2. Discussion of Related Art

A level shifter is used for shifting one voltage level to other voltage levels. The level shifter may be used as an interface circuit between at least two circuits using different power voltages or operating based on signals having different voltage levels. Thus, an electronic device using different power voltages may employ one or more level shifters to shift a signal from one voltage level to other voltage levels.

Mobile electronic devices such as cellular phones, personal digital assistants (PDAs), etc. have limited battery power. However, conventional level shifters for mobile electronic devices have an insufficient voltage margin, and relatively high power consumption due to leakage currents.

SUMMARY

A level shifter according to an exemplary embodiment of the present invention includes a first input circuit, a first load circuit, a second input circuit, and a second load circuit. The first input circuit receives a differential signal pair including a first input signal and a second input signal. The first input signal and the second input signal swing between a first high power voltage and a first low power voltage. The first load circuit generates a high voltage, a sub-high voltage, a low voltage, and a sub-low voltage based on the first input signal and the second input signal. The second input circuit receives a first voltage pair including the high voltage and the low voltage, and a second voltage pair including the sub-high voltage and the sub-low voltage. The second load circuit generates an output signal based on the first voltage pair and the second voltage pair. The output signal swings between a second high power voltage and a second low power voltage.

The first load circuit may be coupled to the second input circuit in a cross-coupling structure. The first input circuit and the first load circuit may perform a pull-down operation. The second input circuit and the second load circuit may perform a pull-up operation.

A voltage level of the high voltage may be lower than a voltage level of the first high power voltage. A voltage level of the low voltage may be higher than a voltage level of the second low power voltage. A voltage level of the sub-high voltage may be lower than the voltage level of the high voltage by a sub-voltage. A voltage level of the sub-low voltage may be higher than the voltage level of the low voltage by the sub-voltage.

The first input circuit may include a first PMOS transistor, and a second PMOS transistor. A source terminal of the first PMOS transistor may be coupled to the first high power voltage. A gate terminal of the first PMOS transistor may receive the first input signal. A source terminal of the second PMOS transistor may be coupled to the first high power voltage. A gate terminal of the second PMOS transistor may receive the second input signal.

The first load circuit may include a first NMOS transistor, a second NMOS transistor, a third NMOS transistor, and a fourth NMOS transistor. A drain terminal and a gate terminal of the first NMOS transistor may be coupled to a drain terminal of the first PMOS transistor. A drain terminal and a gate terminal of the second NMOS transistor may be coupled to a drain terminal of the second PMOS transistor. The third NMOS transistor may have a drain terminal coupled to a source terminal of the first NMOS transistor, a gate terminal coupled to the drain terminal of the second NMOS transistor, and a source terminal coupled to the second low power voltage. The fourth NMOS transistor may have a drain terminal coupled to a source terminal of the second NMOS transistor, a gate terminal coupled to the drain terminal of the first NMOS transistor, and a source terminal coupled to the second low power voltage.

The second input circuit may include a fifth NMOS transistor, and a sixth NMOS transistor. A source terminal of the fifth NMOS transistor may be coupled to the source terminal of the second NMOS transistor. A gate terminal of the fifth NMOS transistor may be coupled to the drain terminal of the first NMOS transistor. A source terminal of the sixth NMOS transistor may be coupled to the source terminal of the first NMOS transistor. A gate terminal of the sixth NMOS transistor may be coupled to the drain terminal of the second NMOS transistor.

The second load circuit may include a third PMOS transistor, a fourth PMOS transistor, a fifth PMOS transistor, and a sixth PMOS transistor. A drain terminal and a gate terminal of the third PMOS transistor may be coupled to a drain terminal of the fifth NMOS transistor. A drain terminal and a gate terminal of the fourth PMOS transistor may be coupled to a drain terminal of the sixth NMOS transistor. The fifth PMOS transistor may have a drain terminal coupled to a source terminal of the third PMOS transistor, a gate terminal coupled to the drain terminal of the fourth PMOS transistor, and a source terminal coupled to the second high power voltage. A sixth PMOS transistor may have a drain terminal coupled to a source terminal of the fourth PMOS transistor, a gate terminal coupled to the drain terminal of the third PMOS transistor, and a source terminal coupled to the second high power voltage.

The sub-voltage may correspond to a threshold voltage of the first NMOS transistor and the second NMOS transistor. The first input circuit and the first load circuit may perform a pull-up operation. The second input circuit and the second load circuit may perform a pull-down operation.

A voltage level of the high voltage may be lower than a voltage level of the second high power voltage. A voltage level of the low voltage may be higher than a voltage level of the first low power voltage. A voltage level of the sub-high voltage may be lower than the voltage level of the high voltage by a sub-voltage. A voltage level of the sub-low voltage may be higher than the voltage level of the low voltage by the sub-voltage.

The first input circuit may include a first NMOS transistor, and a second NMOS transistor. A source terminal of the first NMOS transistor may be coupled to the first low power voltage. A gate terminal of the first NMOS transistor may receive the first input signal. A source terminal of the second NMOS transistor may be coupled to the first low power voltage. A gate terminal of the second NMOS transistor may receive the second input signal.

The first load circuit may include a first PMOS transistor, a second PMOS transistor, a third PMOS transistor, and a fourth PMOS transistor. A drain terminal and a gate terminal of the first PMOS transistor may be coupled to a drain terminal of the first NMOS transistor. A drain terminal and a gate terminal of the second PMOS transistor may be coupled to a drain terminal of the second NMOS transistor. The third PMOS transistor may have a drain terminal coupled to a source terminal of the first PMOS transistor, a gate terminal coupled to the drain terminal of the second PMOS transistor, and a source terminal coupled to the second high power voltage. The fourth PMOS transistor may have a drain terminal coupled to a source terminal of the second PMOS transistor, a gate terminal coupled to the drain terminal of the first PMOS transistor, and a source terminal coupled to the second high power voltage.

The second input circuit may include a fifth PMOS transistor, and a sixth PMOS transistor. A source terminal of the fifth PMOS transistor may be coupled to the source terminal of the second PMOS transistor. A gate terminal of the fifth PMOS transistor may be coupled to the drain terminal of the first PMOS transistor. A source terminal of the sixth PMOS transistor may be coupled to the source terminal of the first PMOS transistor. A gate terminal of the sixth PMOS transistor may be coupled to the drain terminal of the second PMOS transistor.

The second load circuit may include a third NMOS transistor, a fourth NMOS transistor, a fifth NMOS transistor, and a sixth NMOS transistor. A drain terminal and a gate terminal of the third NMOS transistor may be coupled to a drain terminal of the fifth PMOS transistor. A drain terminal and a gate terminal of the fourth NMOS transistor may be coupled to a drain terminal of the sixth PMOS transistor. The fifth NMOS transistor may have a drain terminal coupled to a source terminal of the third NMOS transistor, a gate terminal coupled to the drain terminal of the fourth NMOS transistor, and a source terminal coupled to the second low power voltage. The sixth NMOS transistor may have a drain terminal coupled to a source terminal of the fourth NMOS transistor, a gate terminal coupled to the drain terminal of the third NMOS transistor, and a source terminal coupled to the second low power voltage. The sub-voltage may correspond to a threshold voltage of the first PMOS transistor and the second PMOS transistor.

A level shifter according to an exemplary embodiment of the present invention includes first-six PMOS transistors and first-six NMOS transistors. A source terminal of the first PMOS transistor is coupled to a first high power voltage. A gate terminal of the first PMOS transistor receives a first input signal. A source terminal of the second PMOS transistor is coupled to the first high power voltage. A gate terminal of the second PMOS transistor receives a second input signal that is inverted from the first input signal. A drain terminal and a gate terminal of the first NMOS transistor are coupled to a drain terminal of the first PMOS transistor. A drain terminal and a gate terminal of the second NMOS transistor are coupled to a drain terminal of the second PMOS transistor. A drain terminal of the third NMOS transistor is coupled to a source terminal of the first NMOS transistor. A gate terminal of the third NMOS transistor is coupled to the drain terminal of the second NMOS transistor. A source terminal of the third NMOS transistor is coupled to a second low power voltage. The fourth NMOS transistor has a drain terminal coupled to a source terminal of the second NMOS transistor, a gate terminal coupled to the drain terminal of the first NMOS transistor, and a source terminal coupled to the second low power voltage. A source terminal of the fifth NMOS transistor is coupled to the source terminal of the second NMOS transistor. A gate terminal of the fifth NMOS transistor is coupled to the drain terminal of the first NMOS transistor. A source terminal of the sixth NMOS transistor is coupled to the source terminal of the first NMOS transistor. A gate terminal of the sixth NMOS transistor is coupled to the drain terminal of the second NMOS transistor. A drain terminal and a gate terminal of the third PMOS transistor are coupled to a drain terminal of the fifth NMOS transistor. A drain terminal and a gate terminal of the fourth PMOS transistor are coupled to a drain terminal of the sixth NMOS transistor. The fifth PMOS transistor has a drain terminal coupled to a source terminal of the third PMOS transistor, a gate terminal coupled to the drain terminal of the fourth PMOS transistor, and a source terminal coupled to the second high power voltage. The sixth PMOS transistor has a drain terminal coupled to a source terminal of the fourth PMOS transistor, a gate terminal coupled to the drain terminal of the third PMOS transistor, and a source terminal coupled to the second high power voltage.

A display device according to an exemplary embodiment of the present invention includes a display panel, a source-line driver, a gate-line driver, and a timing controller. The display panel has a plurality of source-lines, a plurality of gate-lines, and a plurality of thin film transistors disposed between the source-lines and the gate-lines. The source-line driver outputs data voltages to the source lines. The gate-line driver outputs gate voltages to the gate lines. The gate-line driver includes a level shifter. The timing controller controls the source-line driver and the gate line driver. The level shifter includes first-six NMOS transistors and first-six PMOS transistors. A source terminal of the first NMOS transistor is coupled to a first low power voltage. A gate terminal of the first NMOS transistor receives a first input signal. A source terminal of the second NMOS transistor is coupled to the first low power voltage. A gate terminal of the second NMOS transistor receives a second input signal that is inverted from the first input signal. A drain terminal and a gate terminal of the first PMOS transistor are coupled to a drain terminal of the first NMOS transistor. A drain terminal and a gate terminal of the second PMOS transistor are coupled to a drain terminal of the second NMOS transistor. The third PMOS transistor has a drain terminal coupled to a source terminal of the first PMOS transistor, a gate terminal coupled to the drain terminal of the second PMOS transistor, and a source terminal coupled to a second high power voltage. The fourth PMOS transistor has a drain terminal coupled to a source terminal of the second PMOS transistor, a gate terminal coupled to the drain terminal of the first. PMOS transistor, and a source terminal coupled to the second high power voltage. A source terminal of the fifth PMOS transistor is coupled to the source terminal of the second PMOS transistor. A gate terminal of the fifth PMOS transistor is coupled to the drain terminal of the first PMOS transistor. A source terminal of the sixth PMOS transistor is coupled to the source terminal of the first PMOS transistor, and a gate terminal of the sixth PMOS transistor is coupled to the drain terminal of the second PMOS transistor. A drain terminal and a gate terminal of the third NMOS transistor are coupled to a drain terminal of the fifth PMOS transistor. A drain terminal and a gate terminal of the fourth NMOS transistor are coupled to a drain terminal of the sixth PMOS transistor. A fifth NMOS transistor has a drain terminal coupled to a source terminal of the third NMOS transistor, a gate terminal coupled to the drain terminal of the fourth NMOS transistor, and a source terminal coupled to a second low power voltage. The sixth NMOS transistor has a drain terminal coupled to a source terminal of the fourth NMOS transistor, a gate terminal coupled to the drain terminal of the third NMOS transistor, and a source terminal coupled to the second low power voltage.

BRIEF DESCRIPTION OF THE DRAWINGS

Exemplary embodiments of the present invention will be more clearly understood from the following detailed description taken in conjunction with the accompanying drawings.

DETAILED DESCRIPTION OF EXEMPLARY EMBODIMENTS

Figure 1:
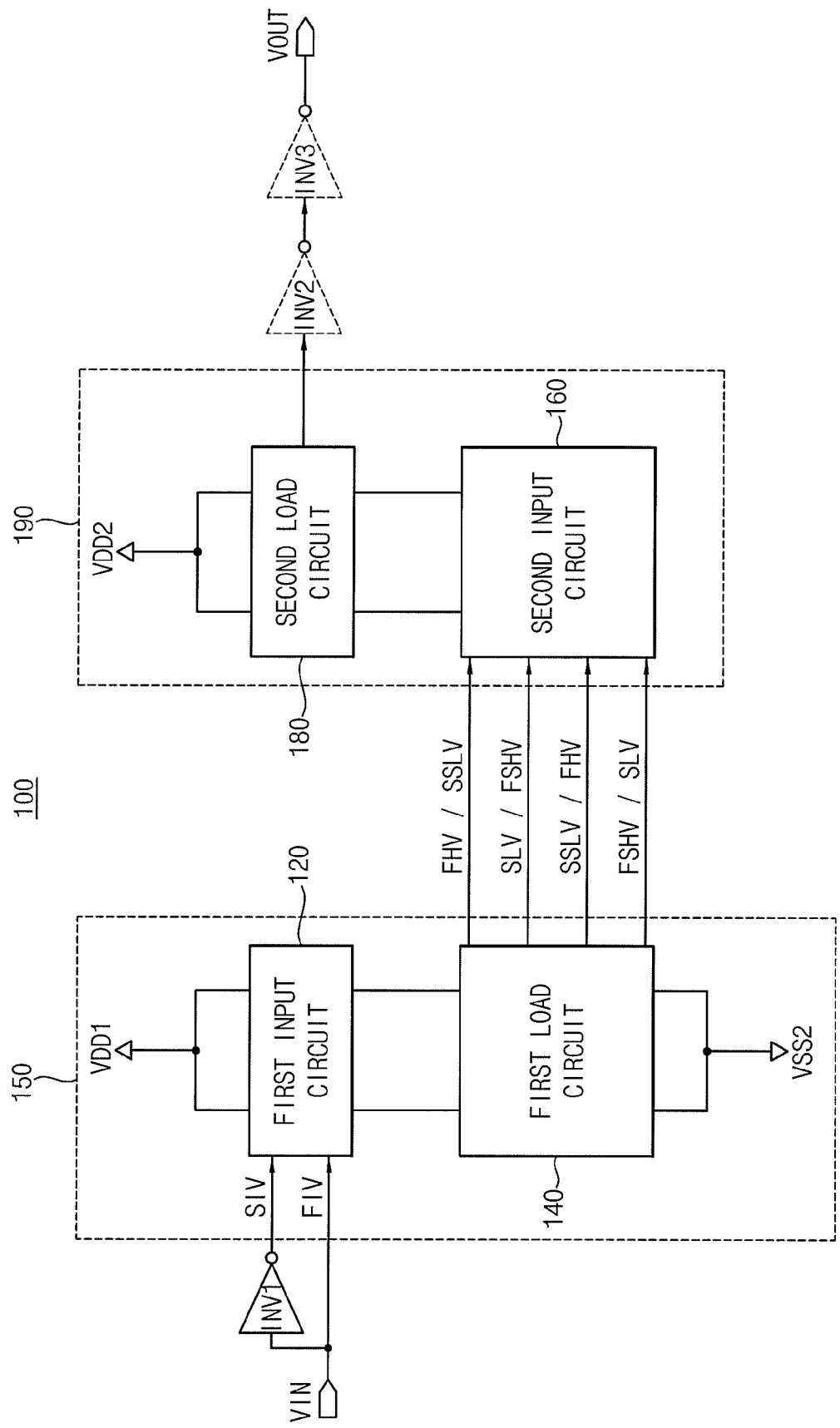
FIG. 1 is a block diagram illustrating a level shifter according to an exemplary embodiment of the present invention.

Exemplary embodiments of the present invention will be described more fully hereinafter with reference to the accompanying drawings. The present inventive concept may, however, be embodied in many different forms and should not be construed as limited to the exemplary embodiments set forth herein. In the drawings, like numerals refer to like elements throughout. It will be understood that when an element is referred to as being "connected" or "coupled" to another element, it can be directly connected or coupled to the other element or intervening elements may be present.

FIG. 1 is a block diagram illustrating a level shifter according to an exemplary embodiment of the present invention. Referring to FIG. 1, the level shifter 100 includes a first input circuit 120, a first load circuit 140, a second input circuit 160, and a second load circuit 180.

The first input circuit 120 receives a first input signal FIV and a second input signal SIV that swing between a first high power voltage VDD1 and a first low power voltage VSS1. The first input signal FIV and the second input signal SIV constitute a differential signal pair. In an exemplary embodiment of the present invention, the first input signal FIV corresponds to an input signal VIN, and the second input signal SIV is the input signal VIN inverted by the inverter INV1. However, the structure in which the first input circuit 120 receives the first input signal FIV and the second input signal SIV is not limited thereto.

The first load circuit 140 generates a first high voltage FHV, a first sub-high voltage FSHV, a second low voltage SLV, and a second sub-low voltage SSLV based on the first input signal FIV and the second input signal SIV. In an exemplary embodiment of the present invention, a voltage level of the first high voltage FHV is lower than a voltage level of the first high power voltage VDD1. A voltage level of the second low voltage SLV may be higher than a voltage level of the second low power voltage VSS2. A voltage level of the first sub-high voltage FSHV may be lower than the voltage level of the first high voltage FHV by a sub-voltage Vth. A voltage level of the second sub-low voltage SSLV may be higher than the voltage level of the second low voltage SLV by the sub-voltage Vth. For example, the first high voltage FHV may have a voltage level VDD1, the first sub-high voltage FSHV may have a voltage level VDD1−Vth, the second low voltage SLV may have a voltage level VSS2, and the second sub-low voltage SSLV may have a voltage level VSS2+Vth. The sub-voltage Vth may be a threshold voltage corresponding to a voltage difference between a gate terminal and a source terminal of a diode-connected n-type metal oxide semiconductor (NMOS) transistor in the first load circuit 140.

The second input circuit 160 receives the first high voltage FHV (e.g., VDD1), the first sub-high voltage FSHV (e.g., VDD1−Vth), the second low voltage SLV (e.g., VSS2), and the second sub-low voltage SSLV (e.g., VSS2+Vth) from the first load circuit 140. In an exemplary embodiment of the present invention, the second input circuit 160 includes a NMOS transistor pair for receiving a first voltage pair including the first high voltage FHV (e.g., VDD1) and the second low voltage SLV (e.g., VSS2), and a second voltage pair including the first sub-high voltage FSHV (e.g., VDD1−Vth) and the second sub-low voltage SSLV (e.g., VSS2+Vth). For example, when the first high voltage FHV (e.g., VDD1) and the second low voltage SLV (e.g., VSS2) are applied to a gate terminal and a source terminal of one NMOS transistor of the transistor pair, respectively, the second sub-low voltage SSLV (e.g., VSS2+Vth) and the first sub-high voltage FSHV (e.g., VDD1−Vth) may be applied to a gate terminal and a source terminal of another NMOS transistor of the transistor pair, respectively. Further, the second input circuit 160 may be coupled to the first load circuit 140 in a cross-coupling structure.

The second load circuit 180 generates an output signal VOUT based on the first high voltage FHV (e.g., VDD1), the first sub-high voltage FSHV (e.g., VDD1−Vth), the second low voltage SLV (e.g., VSS2), and the second sub-low voltage SSLV (e.g., VSS2+Vth). In an exemplary embodiment of the present invention, the output signal VOUT swings between a second high power voltage VDD2 and a second low power voltage VSS2. The output signal VOUT may be outputted through an output buffer (e.g., two inverters INV2 and INV3). However, the structure in which the second load circuit 180 outputs the output signal VOUT is not limited thereto.

The level shifter 100 may have a two-stage structure in which a first stage 150 includes the first input circuit 120 and the first load circuit 140, and a second stage 190 includes the second input circuit 160 and the second load circuit 180. The first stage 150 may perform a pull-down operation for shifting the input signal VIN from a first voltage swing level (e.g., VDD1~VSS1) to a second voltage swing level (e.g., VDD1~VSS2). The second stage 190 may perform a pull-up operation for shifting the input signal VIN from the second voltage swing level (e.g., VDD1~VSS2) to a third voltage swing level (e.g., VDD2~VSS2).

A level shifter may have a first stage having four transistors and a second stage having four transistors (i.e., a 4TR-4TR structure), or a first stage having six transistors and a second stage having six transistors (i.e., a 6TR-6TR structure). The level shifter having the 4TR-4TR structure may have a low degree of integration due to its use of large-size transistors to achieve proper AC/DC efficiencies. The level shifter having the 6TR-6TR structure may have an insufficient voltage margin, and relatively high power consumption due to leakage currents. However, the level shifter 100 may have a sufficient voltage margin for shifting one voltage level to other voltage levels, may decrease power consumption by reducing leakage currents, and may be implemented with a high degree of integration by using small-size transistors.

Figure 2:
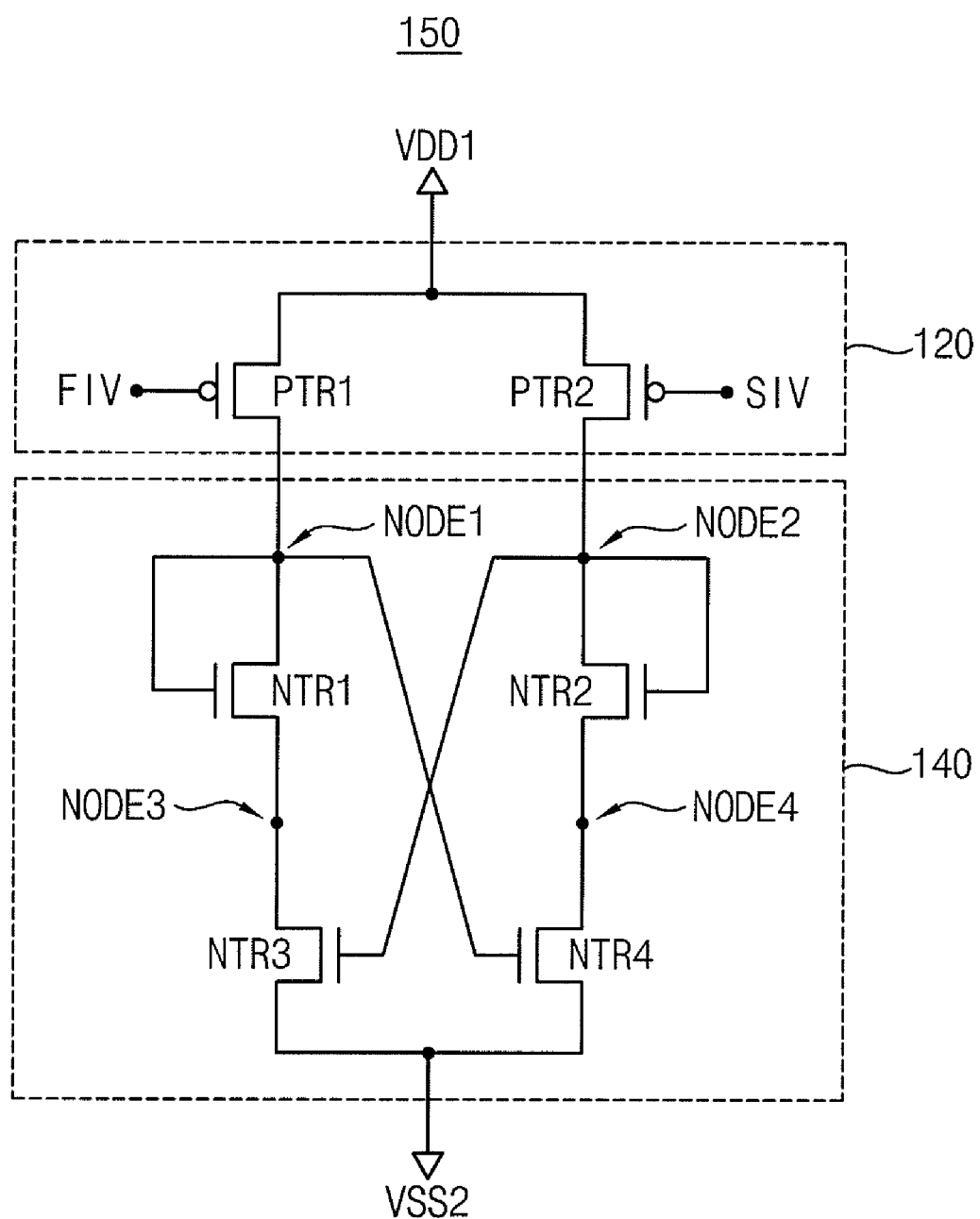
FIG. 2 is a circuit diagram illustrating a first stage in the level shifter of FIG. 1 according to an exemplary embodiment of the present invention.

FIG. 2 is a circuit diagram illustrating a first stage in the level shifter of FIG. 1 according to an exemplary embodiment of the present invention. Referring to FIG. 2, the first stage 150 includes the first input circuit 120 and the first load circuit 140. The first input circuit 120 may include a first p-type metal oxide semiconductor (PMOS) transistor PTR1 and a second PMOS transistor PTR2. The first load circuit 140 may include a first NMOS transistor NTR1, a second NMOS transistor NTR2, a third NMOS transistor NTR3, and a fourth NMOS transistor NTR4.

In an exemplary embodiment of the first input circuit 120, the first PMOS transistor PTR1 includes a gate terminal for receiving the first input signal FIV, a source terminal coupled to the first high power voltage VDD1, and a drain terminal coupled to a drain terminal of the first NMOS transistor NTR1. The second PMOS transistor PTR2 may include a gate terminal for receiving the second input signal SIV, a source terminal coupled to the first high power voltage VDD1, and a drain terminal coupled to a drain terminal of the second NMOS transistor NTR2. However, the first input circuit 120 is not limited to the structure shown in FIG. 2.

In an exemplary embodiment of the first load circuit 140, the first NMOS transistor NTR1 is a diode-connected NMOS transistor that includes a gate terminal and the drain terminal coupled to the drain terminal of the first PMOS transistor PTR1, and a source terminal coupled to a drain terminal of the third NMOS transistor NTR3. Further, the drain terminal of the first NMOS transistor NTR1 may be coupled to a gate terminal of the fourth NMOS transistor NTR4. The second NMOS transistor NTR2 may be a diode-connected NMOS transistor that includes a gate terminal and the drain terminal coupled to the drain terminal of the second PMOS transistor PTR2, and a source terminal coupled to a drain terminal of the fourth NMOS transistor NTR4. In addition, the drain terminal of the second NMOS transistor NTR2 may be coupled to a gate terminal of the third NMOS transistor NTR3. The third NMOS transistor NTR3 may include the drain terminal coupled to the source terminal of the first NMOS transistor NTR1, the gate terminal coupled to the drain terminal of the second NMOS transistor NTR2, and a source terminal coupled to the second low power voltage VSS2. The fourth NMOS transistor NTR4 may include the drain terminal coupled to the source terminal of the second NMOS transistor NTR2, the gate terminal coupled to the drain terminal of the first NMOS transistor NTR1, and a source terminal coupled to the second low power voltage VSS2.

Referring to FIG. 2, the drain terminal of the first NMOS transistor NTR1 corresponds to a first node NODE1, the drain terminal of the second NMOS transistor NTR2 corresponds to a second node NODE2, the source terminal of the first NMOS transistor NTR1 corresponds to a third node NODE3, and the source terminal of the second NMOS transistor NTR2 corresponds to a fourth node NODE4. Threshold voltages of the first NMOS transistor NTR1 and the second NMOS transistor NTR2 may be substantially the same, and the threshold voltage may be the sub-voltage Vth. The sub-voltage Vth may correspond to a voltage difference between the first node NODE1 and the third node NODE3, and a voltage difference between the second node NODE2 and the fourth node NODE4. Thus, the first node NODE1 and the second node NODE2 may output the first high voltage FHV (e.g., VDD1) or the second sub-low voltage SSLV (e.g., VSS2+Vth). The third node NODE3 and the fourth node NODE4 may output the second low voltage SLV (e.g., VSS2) or the first sub-high voltage FSHV (e.g., VDD1−Vth).

Figure 3:
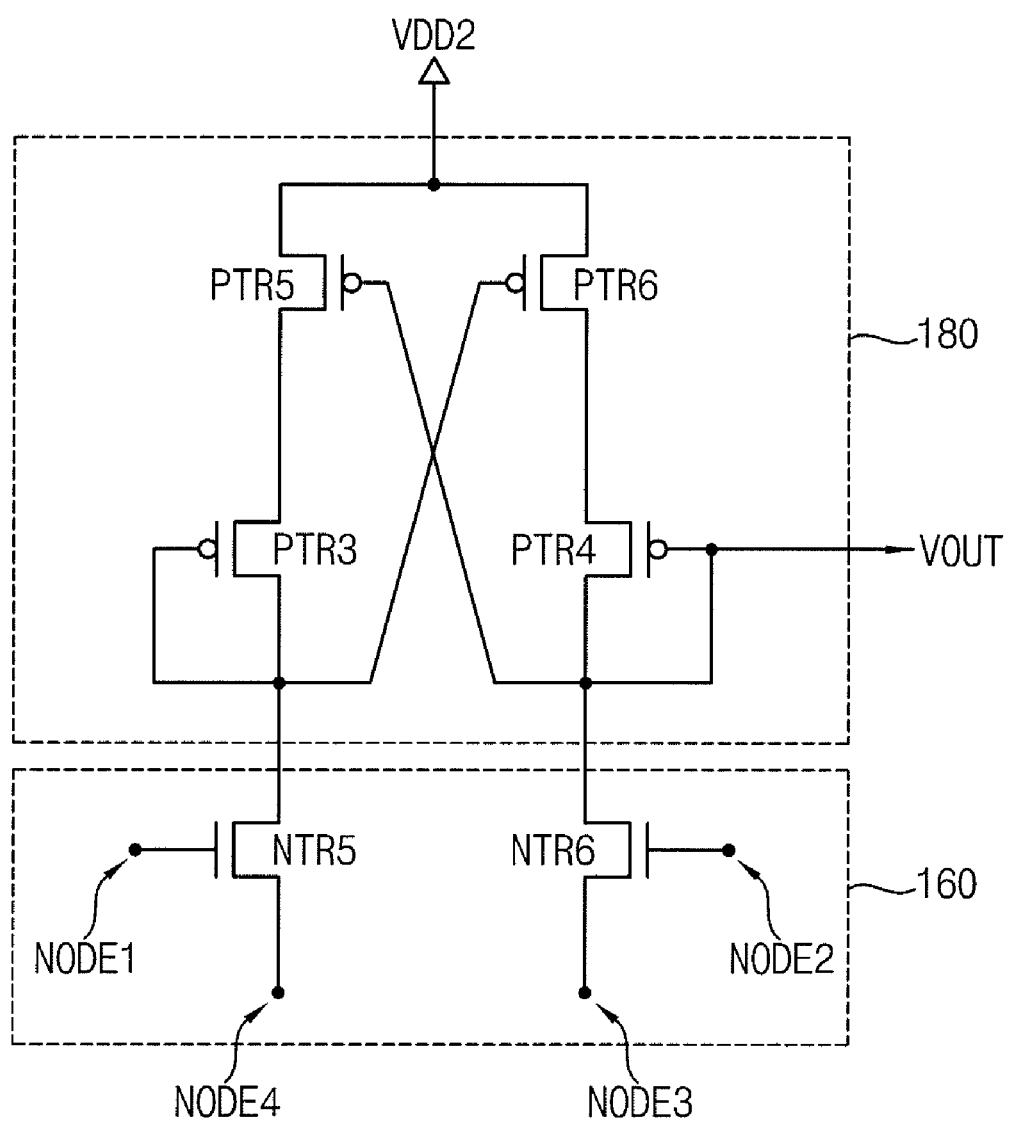
FIG. 3 is a circuit diagram illustrating a second stage in the level shifter of FIG. 1 according to an exemplary embodiment of the present invention.

FIG. 3 is a circuit diagram illustrating a second stage in the level shifter of FIG. 1 according to an exemplary embodiment of the present invention. Referring to FIG. 3, the second stage 190 includes the second input circuit 160 and the second load circuit 180. The second input circuit 160 may include a fifth NMOS transistor NTR5 and a sixth NMOS transistor NTR6. The second load circuit 180 may include a third PMOS transistor PTR3, a fourth PMOS transistor PTR4, a fifth PMOS transistor PTR5, and a sixth PMOS transistor PTR6.

In an exemplary embodiment of the second input circuit 160, the fifth NMOS transistor NTR5 includes a gate terminal coupled to the first node NODE1, a source terminal coupled to the fourth node NODE4, and a drain terminal coupled to a drain terminal of the third PMOS transistor PTR3. The sixth NMOS transistor NTR6 may include a gate terminal coupled to the second node NODE2, a source terminal coupled to the third node3 NODE3, and a drain terminal of a drain terminal of the fourth PMOS transistor PTR4. The drain terminal of the first NMOS transistor NTR1 corresponds to the first node NODE1, the drain terminal of the second NMOS transistor NTR2 corresponds to the second node NODE2, the source terminal of the first NMOS transistor NTR1 corresponds to the third node NODE3, and the source terminal of the second NMOS transistor NTR2 corresponds to the fourth node NODE4. Thus, a second voltage pair including the second sub-low voltage SSLV (e.g., VSS2+Vth) and the first sub-high voltage FSHV (e.g., VDD1−Vth) is applied to the sixth NMOS transistor NTR6 when a first voltage pair including the first high voltage FHV (e.g., VDD1) and the second low voltage SLV (e.g., VSS2) is applied to the fifth NMOS transistor NTR5. Similarly, the second voltage pair including the second sub-low voltage SSLV (e.g., VSS2+Vth) and the first sub-high voltage FSHV (e.g., VDD1−Vth) is applied to the fifth NMOS transistor NTR5 when the first voltage pair including the first high voltage FHV (e.g., VDD1) and the second low voltage SLV (e.g., VSS2) is applied to the sixth NMOS transistor NTR6. The second sub-low voltage SSLV (e.g., VSS2+Vth) and the first sub-high voltage FSHV (e.g., VDD1−Vth) may be applied to the gate terminal and the source terminal of the sixth NMOS transistor NTR6, respectively when the first high voltage FHV (e.g., VDD1) and the second low voltage SLV (e.g., VSS2) are applied to the gate terminal and the source terminal of the fifth NMOS transistor NTR5, respectively. The second sub-low voltage SSLV (e.g., VSS2+Vth) and the first sub-high voltage FSHV (e.g., VDD1−Vth) may be applied to the gate terminal and the source terminal of the fifth NMOS transistor NTR5, respectively when the first high voltage FHV (e.g., VDD1) and the second low voltage SLV (e.g., VSS2) are applied to the gate terminal and the source terminal of the sixth NMOS transistor NTR6, respectively.

In an exemplary embodiment of the second load circuit 180, the third PMOS transistor PTR3 is a diode-connected PMOS transistor that includes a gate terminal and the drain terminal coupled to the drain terminal of the fifth NMOS transistor NTR5, and a source terminal coupled to a drain terminal of the fifth PMOS transistor PTR5. Further, the drain terminal of the third PMOS transistor PTR3 may be coupled to a gate terminal of the sixth PMOS transistor PTR6. The fourth PMOS transistor PTR4 may be a diode-connected PMOS transistor that includes a gate terminal and the drain terminal coupled to the drain terminal of the sixth NMOS transistor NTR6, and a source terminal coupled to a drain terminal of the sixth PMOS transistor PTR6. In addition, the drain terminal of the fourth PMOS transistor PTR4 may be coupled to a gate terminal of the fifth PMOS transistor PTR5. The fifth PMOS transistor PTR5 may include the drain terminal coupled to the source terminal of the third PMOS transistor PTR3, the gate terminal coupled to the drain terminal of the fourth PMOS transistor PTR4, and a source terminal coupled to the second high power voltage VDD2. The sixth PMOS transistor PTR6 may include the drain terminal coupled to the source terminal of the fourth PMOS transistor PTR4, the gate terminal coupled to the drain terminal of the third PMOS transistor PTR3, and a source terminal coupled to the second high power voltage VDD2.

Referring to FIG. 3, the second load circuit 180 includes the third through sixth PMOS transistors PTR3, PTR4, PTR4, and PTR6. In an exemplary embodiment of the second load circuit 180, the drain terminal of the fourth PMOS transistor PTR4 corresponds to an output node for outputting the output signal VOUT. The output signal VOUT may swing between the second high power voltage VDD2 and the second low power voltage VSS2. However, the second load circuit 180 is not limited to the structure shown in FIG. 3. For example, the second load circuit 180 may include two PMOS transistors.

Figure 4:
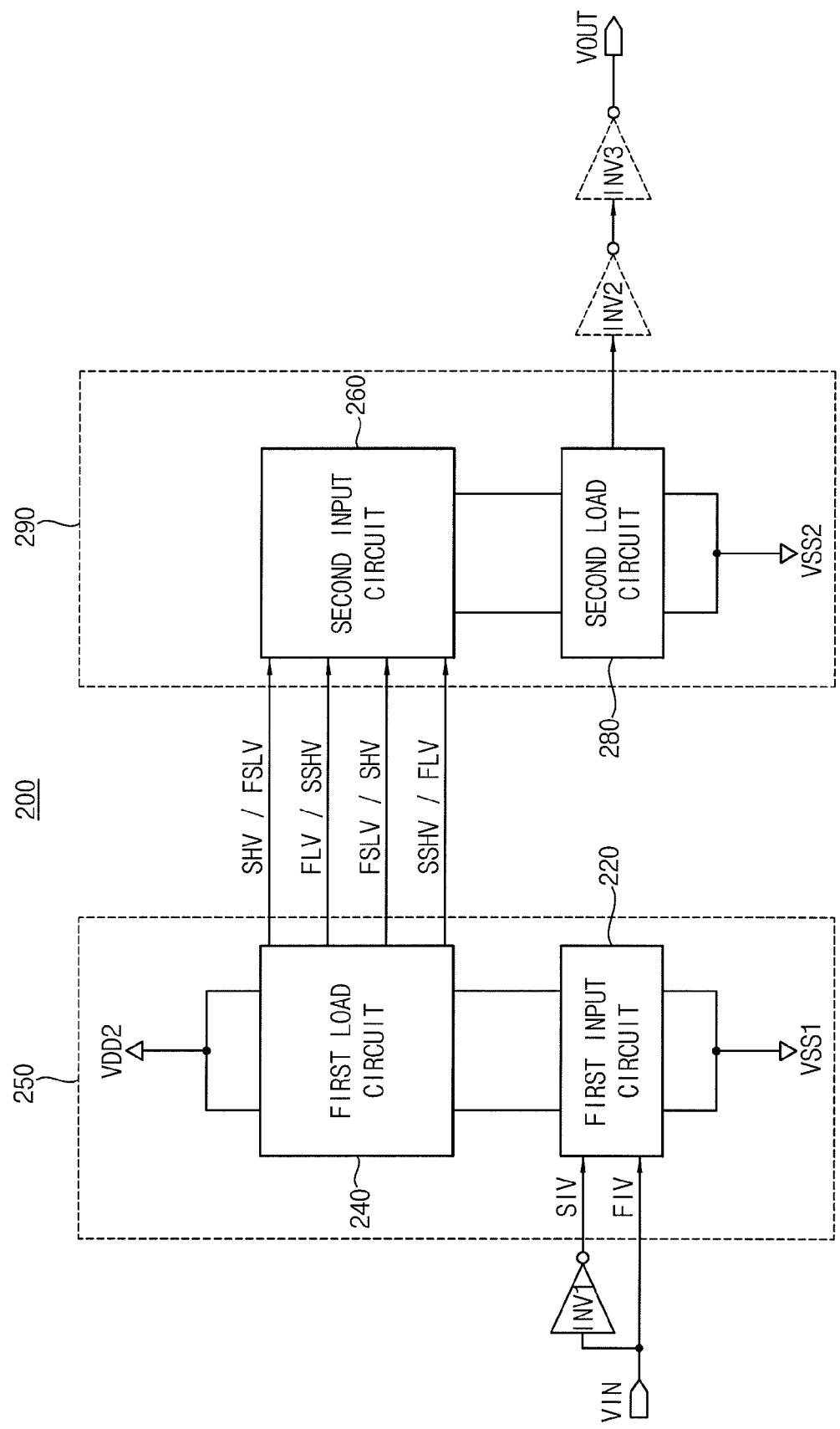
FIG. 4 is a block diagram illustrating a level shifter according to an exemplary embodiment of the present invention.

FIG. 4 is a block diagram illustrating a level shifter according to an exemplary embodiment of the present invention. Referring to FIG. 4, the level shifter 200 includes a first input circuit 220, a first load circuit 240, a second input circuit 260, and a second load circuit 280.

The first input circuit 220 receives a first input signal FIV and a second input signal SIV that swing between a first high power voltage VDD1 and a first low power voltage VSS1. The first input signal FIV and the second input signal SIV constitute a differential signal pair. In an exemplary embodiment of the present invention, the first input signal FIV corresponds to an input signal VIN, and the second input signal SIV is the input signal VIN inverted by the inverter INV1. However, the structure in which the first input circuit 220 receives the first input signal FIV and the second input signal SIV is not limited thereto.

The first load circuit 240 generates a second high voltage SHV, a second sub-high voltage SSHV, a first low voltage FLV, and a first sub-low voltage FSLV based on the first input signal FIV and the second input signal SIV. In an exemplary embodiment of the present invention, a voltage level of the second high voltage SHV is lower than a voltage level of the second high power voltage VDD2. A voltage level of the first low voltage FLV may be higher than a voltage level of the first low power voltage VSS1. A voltage level of the second sub-high voltage SSHV may be lower than the voltage level of the second high voltage SHV by a sub-voltage Vth. A voltage level of the first sub-low voltage FSLV may be higher than the voltage level of the first low voltage FLV by the sub-voltage Vth. For example, the second high voltage SHV may have a voltage level VDD2, the second sub-high voltage SSHV may have a voltage level VDD2−Vth, the first low voltage FLV may have a voltage level VSS1, and the second sub-low voltage FSLV may have a voltage level VSS1+Vth. The sub-voltage Vth may be a threshold voltage corresponding to a voltage difference between a gate terminal and a source terminal of a diode-connected PMOS transistor in the first load circuit 240.

The second input circuit 260 receives the second high voltage SHV (e.g., VDD2), the second sub-high voltage SSHV (e.g., VDD2−Vth), the first low voltage FLV (e.g., VSS1), and the first sub-low voltage FSLV (e.g., VSS1+Vth) from the first load circuit 240. In an exemplary embodiment of the present invention, the second input circuit 260 includes a PMOS transistor pair for receiving a first voltage pair including the second high voltage SHV (e.g., VDD2) and the first low voltage FLV (e.g., VSS1), and a second voltage pair including the second sub-high voltage SSHV (e.g., VDD2−Vth) and the first sub-low voltage FSLV (VSS1+Vth). For example, when the second high voltage SHV (e.g., VDD2) and the first low voltage FLV (e.g., VSS1) are applied to a gate terminal and a source terminal of one PMOS transistor of the transistor pair, respectively, the first sub-low voltage FSLV (e.g., VSS1+Vth) and the second sub-high voltage SSHV (e.g., VDD2−Vth) may be applied to a gate terminal and a source terminal of the other PMOS transistor of the transistor pair, respectively. Further, the second input circuit 260 may be coupled to the first load circuit 240 in a cross-coupling structure.

The second load circuit 280 generates an output signal VOUT based on the second high voltage SHV (e.g., VDD2), the second sub-high voltage SSHV (e.g., VDD2−Vth), the first low voltage FLV (e.g., VSS1), and the first sub-low voltage FSLV (e.g., VSS1+Vth). In an exemplary embodiment of the present invention, the output signal VOUT swings between the second high power voltage VDD2 and the second low power voltage VSS2. The output signal VOUT may be outputted through an output buffer (e.g., two inverters INV2 and INV3). However, the structure in which the second load circuit 280 outputs the output signal VOUT is not limited thereto.

The level shifter 200 may have a two-stage structure in which a first stage 250 includes the first input circuit 220 and the first load circuit 240, and a second stage 290 includes the second input circuit 260 and the second load circuit 280. The first stage 250 may perform a pull-up operation for shifting the input signal VIN from a first voltage swing level (e.g., VDD1~VSS1) to a second voltage swing level (e.g., VDD2~VSS1). The second stage 290 may perform a pull-down operation for shifting the input signal VIN from the second voltage swing level (e.g., VDD2~VSS1) to a third voltage swing level (e.g., VDD2~VSS2). Thus, the level shifter 200 may have a sufficient voltage margin for shifting one voltage level to other voltage levels, may decrease power consumption by reducing leakage currents, and may be implemented with a high degree of integration by using small-size transistors.

Figure 5:
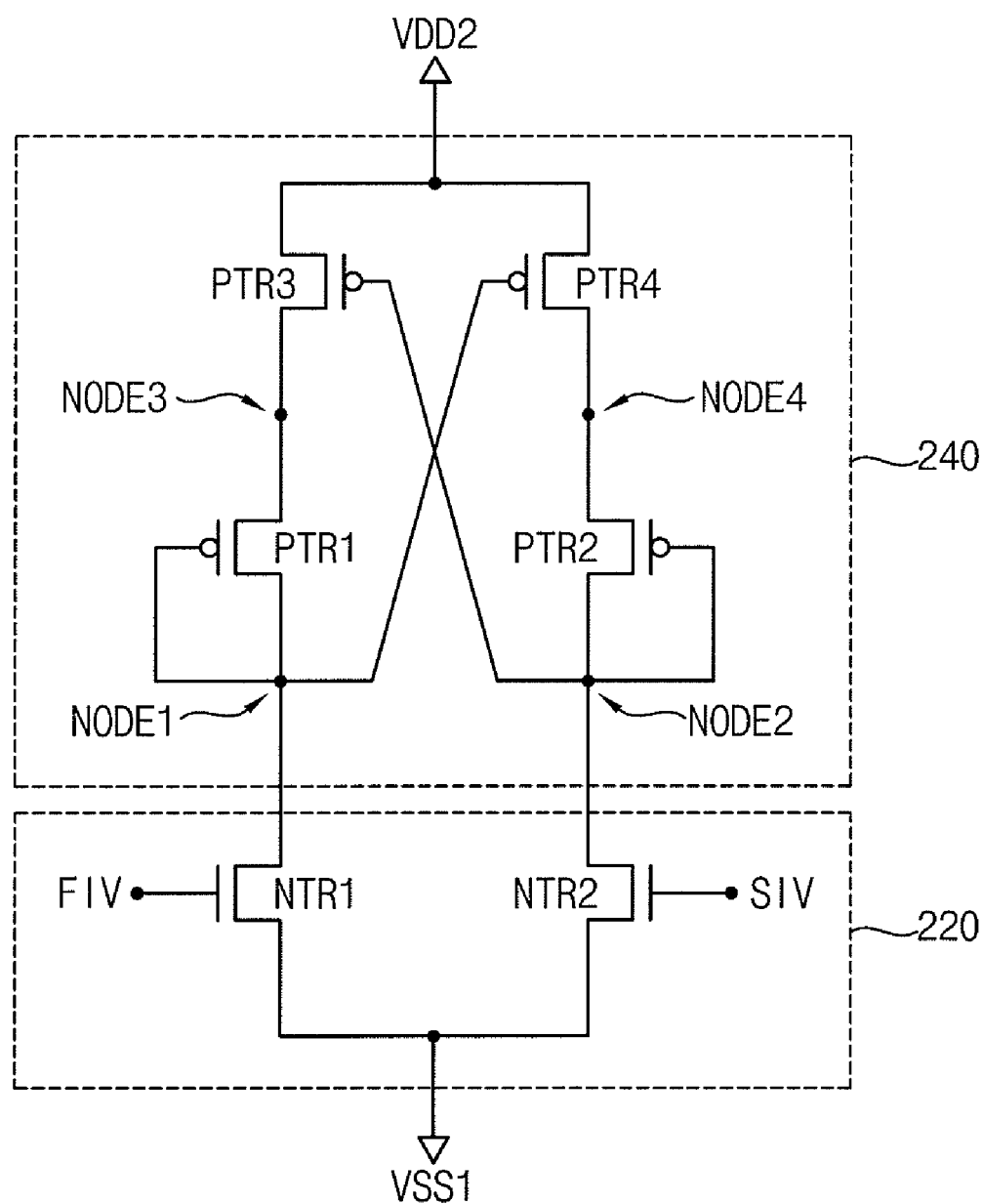
FIG. 5 is a circuit diagram illustrating a first stage in the level shifter of FIG. 4 according to an exemplary embodiment of the present invention.

FIG. 5 is a circuit diagram illustrating a first stage in the level shifter of FIG. 4 according to an exemplary embodiment of the present invention. Referring to FIG. 5, the first stage 250 includes the first input circuit 220 and the first load circuit 240. The first input circuit 220 may include a first NMOS transistor NTR1 and a second NMOS transistor NTR2. The first load circuit 240 may include a first PMOS transistor PTR1, a second PMOS transistor PTR2, a third PMOS transistor PTR3, and a fourth PMOS transistor PTR4.

In an exemplary embodiment of the first input circuit 220, the first NMOS transistor NTR1 includes a gate terminal for receiving the first input signal FIV, a source terminal coupled to the first low power voltage VSS1, and a drain terminal coupled to a drain terminal of the first PMOS transistor PTR1. The second NMOS transistor NTR2 may include a gate terminal for receiving the second input signal SIV, a source terminal coupled to the first low power voltage VSS1, and a drain terminal coupled to a drain terminal of the second PMOS transistor PTR2. However the first input circuit 220 is not limited to the structure shown in FIG. 5.

In an exemplary embodiment of the first load circuit 240, the first PMOS transistor PTR1 is a diode-connected PMOS transistor that includes a gate terminal and the drain terminal coupled to the drain terminal of the first NMOS transistor NTR1, and a source terminal coupled to a drain terminal of the third PMOS transistor PTR3. Further, the drain terminal of the first PMOS transistor PTR1 may be coupled to a gate terminal of the fourth PMOS transistor PTR4. The second PMOS transistor PTR2 may be a diode-connected PMOS transistor that includes a gate terminal and the drain terminal coupled to the drain terminal of the second NMOS transistor NTR2, and a source terminal coupled to a drain terminal of the fourth PMOS transistor PTR4. In addition, the drain terminal of the second PMOS transistor PTR2 may be coupled to a gate terminal of the third PMOS transistor PTR3. The third PMOS transistor PTR3 may include the drain terminal coupled to the source terminal of the first PMOS transistor PTR1, the gate terminal coupled to the drain terminal of the second PMOS transistor PTR2, and a source terminal coupled to the second high power voltage VDD2. The fourth PMOS transistor PTR4 may include the drain terminal coupled to the source terminal of the second PMOS transistor PTR2, the gate terminal coupled to the drain terminal of the first PMOS transistor PTR1, and a source terminal coupled to the second high power voltage VDD2.

Referring to FIG. 5, the drain terminal of the first PMOS transistor PTR1 corresponds to a first node NODE1, the drain terminal of the second PMOS transistor PTR2 corresponds to a second node NODE2, the source terminal of the first PMOS transistor PTR1 corresponds to a third node NODE3, and the source terminal of the second PMOS transistor PTR2 corresponds to a fourth node NODE4. Threshold voltages of the first PMOS transistor PTR1 and the second PMOS transistor PTR2 may be substantially the same, and the threshold voltage may be the sub-voltage Vth. The sub-voltage Vth may correspond to a voltage difference between the first node NODE1 and the third node NODE3, and a voltage difference between the second node NODE2 and the fourth node NODE4. Thus, the first node NODE1 and the second node NODE2 may output the first low voltage FLU (e.g., VSS1) or the second sub-high voltage SSHV (e.g., VDD2−Vth). The third node NODE3 and the fourth node NODE4 may output the second high voltage SHV (e.g., VDD2) or the first sub-low voltage FSLV (e.g., VSS1+Vth).

Figure 6:
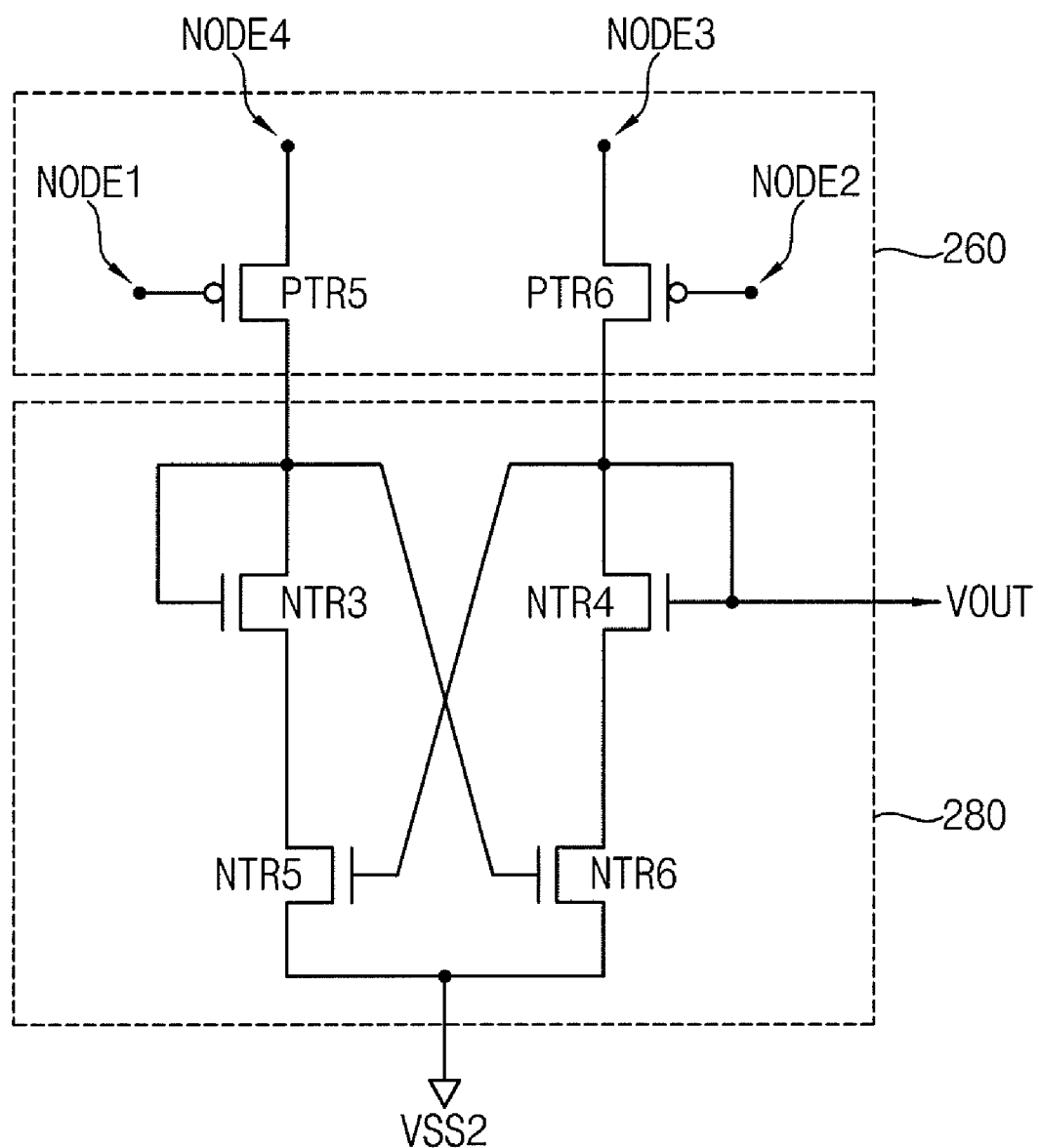
FIG. 6 is a circuit diagram illustrating a second stage in the level shifter of FIG. 4 according to an exemplary embodiment of the present invention.

FIG. 6 is a circuit diagram illustrating a second stage in the level shifter of FIG. 4 according to an exemplary embodiment of the present invention. Referring to FIG. 6, the second stage 290 includes the second input circuit 260 and the second load circuit 280. The second input circuit 260 may include a fifth PMOS transistor PTR5 and a sixth PMOS transistor PTR6. The second load circuit 280 may include a third NMOS transistor NTR3, a fourth NMOS transistor NTR4, a fifth NMOS transistor NTR5, and a sixth NMOS transistor NTR6.

In an exemplary embodiment of the second input circuit 260, the fifth PMOS transistor PTR5 includes a gate terminal coupled to the first node NODE1, a source terminal coupled to the fourth node NODE4, and a drain terminal coupled to a drain terminal of the third NMOS transistor NTR3. The sixth PMOS transistor PTR6 may include a gate terminal coupled to the second node NODE2, a source terminal coupled to the third node NODE3, and a drain terminal of a drain terminal of the fourth NMOS transistor NTR4. The drain terminal of the first PMOS transistor PTR1 corresponds to the first node NODE1, the drain terminal of the second PMOS transistor PTR2 corresponds to the second node NODE2, the source terminal of the first PMOS transistor PTR1 corresponds to the third node NODE3, and the source terminal of the second PMOS transistor PTR2 corresponds to the fourth node NODE4. Thus, a second voltage pair including the first sub-low voltage FSLV (e.g., VSS1+Vth) and the second sub-high voltage SSHV (e.g., VDD2−Vth) is applied to the sixth PMOS transistor PTR6 when a first voltage pair including the second high voltage SHV (e.g., VDD2) and the first low voltage FLV (e.g., VSS1) is applied to the fifth PMOS transistor PTR5. Similarly, the second voltage pair including the first sub-low voltage FSLV (e.g., VSS1+Vth) and the second sub-high voltage SSHV (e.g., VDD2−Vth) is applied to the fifth PMOS transistor PTR5 when the first voltage pair including the second high voltage SHV (e.g., VDD2) and the first low voltage FLV (e.g., VSS1) is applied to the sixth PMOS transistor PTR6. The second sub-high voltage SSHV (e.g., VDD2−Vth) and the first sub-low voltage FSLV (e.g., VSS1+Vth) may be applied to the gate terminal and the source terminal of the sixth PMOS transistor PTR6, respectively when the first low voltage FLV (e.g., VSS1) and the second high voltage SHV (e.g., VDD2) are applied to the gate terminal and the source terminal of the fifth PMOS transistor PTR5, respectively. The second sub-high voltage SSHV (e.g., VDD2−Vth) and the first sub-low voltage FSLV (e.g., VSS1+Vth) may be applied to the gate terminal and the source terminal of the fifth PMOS transistor PTR5, respectively when the first low voltage FLV (e.g., VSS1) and the second high voltage SHV (e.g., VDD2) are applied to the gate terminal and the source terminal of the sixth PMOS transistor PTR6, respectively.

In an exemplary embodiment of the second load circuit 280, the third NMOS transistor NTR3 is a diode-connected NMOS transistor that includes a gate terminal and the drain terminal coupled to the drain terminal of the fifth PMOS transistor PTR5, and a source terminal coupled to a drain terminal of the fifth NMOS transistor NTR5. Further, the drain terminal of the third NMOS transistor NTR3 may be coupled to a gate terminal of the sixth NMOS transistor NTR6. The fourth NMOS transistor NTR4 may be a diode-connected NMOS transistor that includes a gate terminal and the drain terminal coupled to the drain terminal of the sixth PMOS transistor PTR6, and a source terminal coupled to a drain terminal of the sixth NMOS transistor NTR6. In addition, the drain terminal of the fourth NMOS transistor NTR4 may be coupled to a gate terminal of the fifth NMOS transistor NTR5. The fifth NMOS transistor NTR5 may include the drain terminal coupled to the source terminal of the third NMOS transistor NTR3, the gate terminal coupled to the drain terminal of the fourth NMOS transistor NTR4, and a source terminal coupled to the second low power voltage VSS2. The sixth NMOS transistor NTR6 may include the drain terminal coupled to the source terminal of the fourth NMOS transistor NTR4, the gate terminal coupled to the drain terminal of the third NMOS transistor NTR3, and a source terminal coupled to the second low power voltage VSS2.

Referring to FIG. 6, the second load circuit 280 includes the third through sixth NMOS transistors NTR3, NTR4, NTR4, and NTR6. In an exemplary embodiment of the second load circuit 280, the drain terminal of the fourth NMOS transistor NTR4 may correspond to an output node for outputting the output signal VOUT. The output signal VOUT may swing between the second high power voltage VDD2 and the second low power voltage VSS2. However, the second load circuit 280 is not limited to the structure shown in FIG. 6. For example, the second load circuit 280 may include two NMOS transistors.

Figure 7:
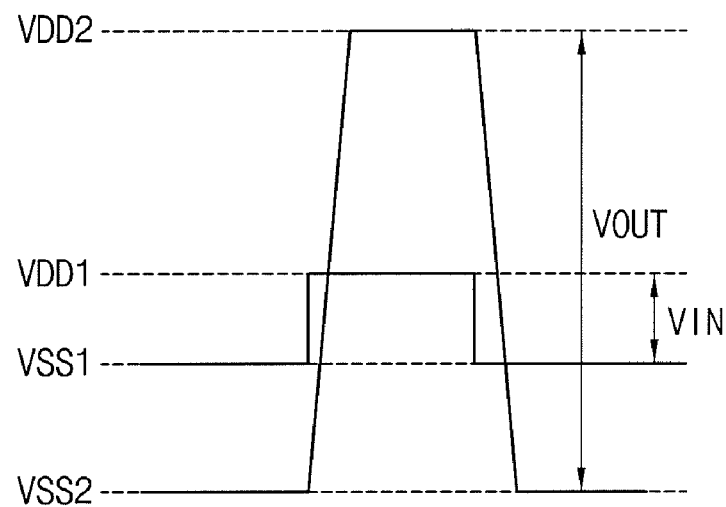
FIG. 7 is an exemplary graph illustrating an input signal and an output signal in a level shifter according to an exemplary embodiment of the present invention.

FIG. 7 is an exemplary graph illustrating an input signal and an output signal in a level shifter according to an exemplary embodiment of the present invention. Referring to FIG. 7, when the level shifters 100 and 200 receive the input signal VIN that swings between the first high power voltage VDD1 and the first low power voltage VSS1, the level shifters 100 and 200 may output the output signal VOUT that swings between the second high power voltage VDD2 and the second low power voltage VSS2. Thus, when an electronic device including a plurality of circuits that use different power voltages employs the level shifters 100 and 200, the electronic device may operate by using a plurality of power voltages based on the first high power voltage VDD1, the first low power voltage VSS1, the second high power voltage VDD2, and the second low power voltage VSS2.

In an exemplary embodiment of the present invention, when the level shifter 100 receives the input signal VIN, the first stage 150 performs the pull-down operation to shift the input signal VIN from the first voltage swing level (e.g., VDD1~VSS1) to the second voltage swing level (e.g., VDD1~VSS2), and the second stage 190 performs the pull-up operation to shift the input signal VIN from the second voltage swing level (e.g., VDD1~VSS2) to the third voltage swing level (e.g., VDD2~VSS2). In an exemplary embodiment of the present invention, when the level shifter 200 receives the input signal VIN, the first stage 250 performs the pull-up operation to shift the input signal VIN from the first voltage swing level (e.g., VDD1~VSS1) to the second voltage swing level (e.g., VDD2~VSS1), and the second stage 290 performs the pull-down operation to shift the input signal VIN from the second voltage swing level (e.g., VDD2~VSS1) to the third voltage swing level (e.g., VDD2~VSS2).

The level shifter 100 may include the first stage 150 having the diode-connected NMOS transistors NTR1 and NTR2, and the level shifter 200 may include the first stage 250 having the diode-connected PMOS transistors PTR1 and PTR2. The diode-connected transistors NTR1, NTR2, PTR1, and PTR2 may operate as active resistors during the pull-up operation and the pull-down operation. In addition, the level shifters 100 and 200 may be implemented with small-size transistors. The small-size transistors may result in reductions of circuit area and parasitic capacitance. As a result, the level shifters 100 and 200 may perform high speed operations while decreasing power consumption.

Further, in the level shifter 100, the first through fourth nodes NODE1, NODE2, NODE3, and NODE4 in the first load circuit 140 may be coupled to the second input circuit 160 in a cross-coupling structure. Thus, the output range of the first stage 150 may be from the second low power voltage VSS2 to the first high power voltage VDD1.

Similarly, in the level shifter 200, the first through fourth nodes NODE1, NODE2, NODE3, and NODE4 in the first load circuit 240 may be coupled to the second input circuit 260 in a cross-coupling structure. Thus, the output range of the first stage 250 may be from the first low power voltage VSS1 to the second high power voltage VDD2. As a result, the level shifters 100 and 200 may prevent output range restrictions due to the diode-connected transistors NTR1, NTR2, PTR1, and PTR2, and may decrease power consumption due to leakage currents.

Figure 8A:
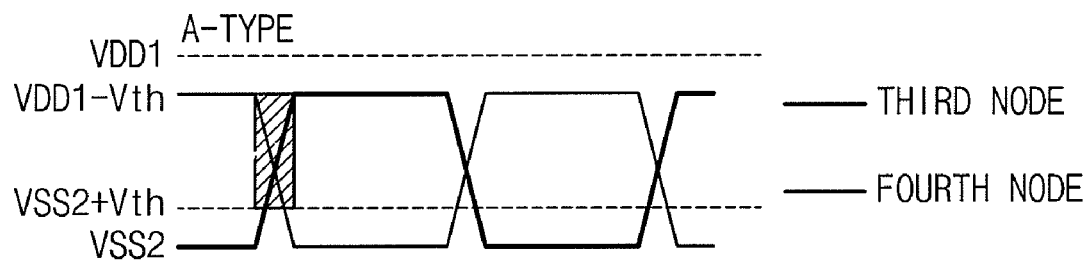
FIG. 8A is an exemplary graph illustrating an output range of a first load circuit when a third node and a fourth node of the first load circuit are coupled to a second input circuit in a level shifter according to an exemplary embodiment of the present invention.

FIG. 8A is an exemplary graph illustrating an output range of a first load circuit when a third node and a fourth node of the first load circuit are coupled to a second input circuit in a level shifter according to an exemplary embodiment of the present invention. Here, the graph will be described with reference to the level shifter 100 of FIG. 1.

Referring to FIG. 8A, the graph of a first type A-TYPE may represent the output range of the first load circuit 140 when the third node NODE3 and the fourth node NODE4 in the first load circuit 140 are coupled to the second input circuit 160 in the level shifter 100 of the first type A-TYPE. The gate terminal of the fifth NMOS transistor NTR5 is coupled to the third node NODE3, and the source terminal of the fifth NMOS transistor NTR5 is coupled to the second low power voltage VSS2. The gate terminal of the sixth NMOS transistor NTR6 is coupled to the fourth node NODE4, and the source terminal of the sixth NMOS transistor NTR6 is coupled to the second low power voltage VSS2. As a result, the output range of the first load circuit 140 is from the second low power voltage VSS2 to the first sub-high power voltage VDD1−Vth so that the level shifter 100 of the first type A-TYPE may have an insufficient voltage margin.

Figure 8B:
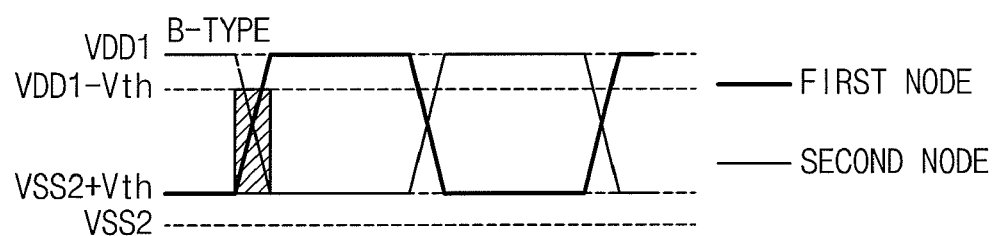
FIG. 8B is an exemplary graph illustrating an output range of a first load circuit when a first node and a second node of the first load circuit are coupled to a second input circuit in a level shifter according to an exemplary embodiment of the present invention.

FIG. 8B is an exemplary graph illustrating an output range of a first load circuit when a first node and a second node of the first load circuit are coupled to a second input circuit in a level shifter according to an exemplary embodiment of the present invention. Here, the graph will be described with reference to the level shifter 100 of FIG. 1.

Referring to FIG. 8B, the graph of a second type B-TYPE may represent the output range of the first load circuit 140 when the first node NODE1 and the second node NODE2 in the first load circuit 140 are coupled to the second input circuit 160 in the level shifter 100 of the second type B-TYPE. The gate terminal of the fifth NMOS transistor NTR5 is coupled to the first node NODE1, and the source terminal of the fifth NMOS transistor NTR5 is coupled to the second low power voltage VSS2. The gate terminal of the sixth NMOS transistor NTR6 is coupled to the second node NODE2, and the source terminal of the sixth NMOS transistor NTR6 is coupled to the second low power voltage VSS2. As a result, the output range of the first load circuit 140 is from the second sub-low power voltage VSS2+Vth to the first high power voltage VDD1. Thus, the level shifter 100 of the second type B-TYPE may have a sufficient voltage margin as compared with the level shifter 100 of the first type A-TYPE. However, the level shifter 100 of the second type B-TYPE in which the second sub-low power voltage VSS2+Vth is applied to the gate terminal of the fifth NMOS transistor NTR5 or the sixth NMOS transistor NTR6 may have a high power consumption due to leakage currents because the voltage difference between the gate terminal and the source terminal of the fifth NMOS transistor NTR5 or the sixth NMOS transistor NTR6 is higher than the threshold voltage Vth.

Figure 8C:
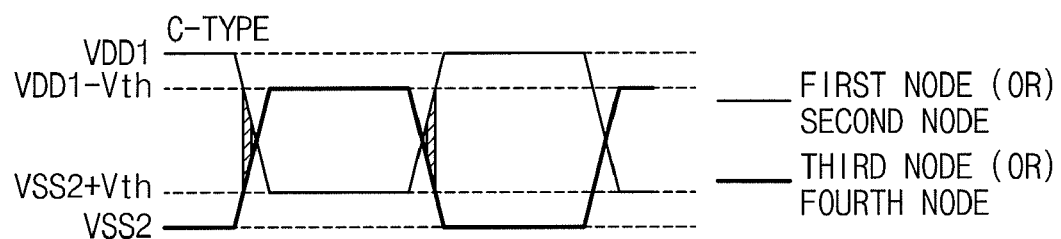
FIG. 8C is an exemplary graph illustrating an output range of a first load circuit when a first node through a fourth node of the first load circuit are coupled to a second input circuit in a level shifter according to an exemplary embodiment of the present invention.

FIG. 8C is an exemplary graph illustrating an output range of a first load circuit when a first node through a fourth node of the first load circuit are coupled to a second input circuit in a level shifter according to an exemplary embodiment of the present invention. Here, the graph will be described with reference to the level shifter 100 of FIG. 1.

Referring to FIG. 8C, the graph of a third type C-TYPE may represent the output range of the first load circuit 140 when the first through fourth node NODE1, NODE2, NODE3, and NODE4 in the first load circuit 140 are coupled in a cross-coupling structure to the second input circuit 160 in the level shifter 100. The coupling structure between the first load circuit 140 and the second input circuit 160 will be described with reference to FIG. 1 through FIG. 3. As described above, the level shifter 100 of the first type A-TYPE may have an insufficient voltage margin. The level shifter 100 of the first type B-TYPE may have high power consumption due to leakage currents. However, the level shifter 100 of the third type C-TYPE may have a sufficient voltage margin because the output range of the first load circuit 140 is from the second low power voltage VSS2 to the first high power voltage VDD1. Further, the level shifter 100 of the third type C-TYPE may decrease power consumption because the first sub-high voltage (e.g., VDD1−Vth) is applied to the source terminal of the fifth NMOS transistor NTR5 or the sixth NMOS transistor NTR6 when the second sub-low voltage (e.g., VSS2+Vth) is applied to the gate terminal of the fifth NMOS transistor NTR5 or the sixth NMOS transistor NTR6.

Figure 9:
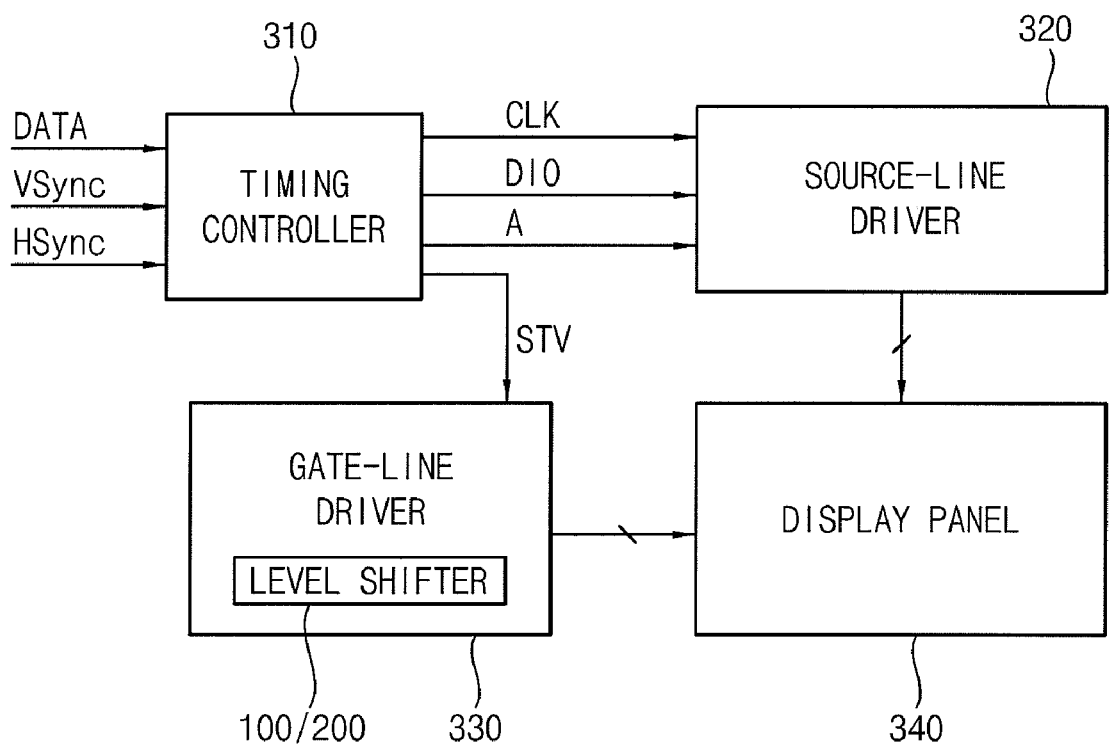
FIG. 9 is a block diagram illustrating a display device having a level shifter according to an exemplary embodiment of the present invention.

FIG. 9 is a block diagram illustrating a display device having a level shifter according to an exemplary embodiment of the present invention. Referring to FIG. 9, the display device 300 includes a timing controller 310, a source-line driver 320, a gate-line driver 330, and a display panel 340. Further, the display panel 340 may include a plurality of source-lines, a plurality of gate-lines, and a plurality of thin film transistors disposed between the source-lines and the gate-lines.

The timing controller 310 may receive digital video data DATA and control signals such as a vertical synchronization signal Vsync and a horizontal synchronization signal Hsync to output an input signal A (e.g., digital video data DATA), a horizontal synchronization start signal DIO, and a clock signal CLK to the source-line driver 320, and to output a vertical synchronization start signal STV to the gate-line driver 330.

The vertical synchronization signal Vsync is a reference signal for constituting one frame. For example, one frame may be displayed during one period of the vertical synchronization signal Vsync. The horizontal synchronization signal Hsync is a reference signal for constituting one line (i.e., one gate-line). For example, one line may be displayed during one period of the horizontal synchronization signal Hsync.

The source-line driver 320 may receive the input signal A, the horizontal synchronization start signal DIO, and the clock signal CLK from the timing controller 310 to drive the plurality of source-lines in the display panel 340. The gate-line driver 330 may sequentially drive the plurality of gate-lines after a logic level of the vertical synchronization start signal STV for selecting the first gate-line is changed from a logic "low" level to a logic "high" level. The gate-line driver 330 may include at least one level shifter 100 or 200.

As described above, a level shifter according to at least one exemplary embodiment of the present invention may have a sufficient voltage margin for shifting one voltage level to other voltage levels, may decrease power consumption by reducing leakage currents, and may be implemented with a high degree of integration by using small-size transistors. Accordingly, such a level shifter may be employed in any electronic device that uses different power voltages. For example, the level shifter according to at least one exemplary embodiment of the present invention may be applied to a laptop computer, a personal computer, a digital TV, a digital camera, a personal digital assistant (PDA), a portable multimedia player (PMP), MPEG Audio Layer-3 player (MP3P), etc.

Although exemplary embodiments of the present invention have been described herein, those skilled in the art will readily appreciate that various modifications can be made in these exemplary embodiments without materially departing from the present invention. Accordingly, all such modifications are intended to be included within the scope of the disclosure.

What is claimed is:

1. A level shifter, comprising:
a first input circuit configured to receive a differential signal pair including a first input signal and a second input signal, the first input signal and the second input signal swinging between a first high power voltage and a first low power voltage;
a first load circuit configured to generate a high voltage, a sub-high voltage, a low voltage, and a sub-low voltage based on the first input signal and the second input signal;
a second input circuit configured to receive a first voltage pair and a second voltage pair, the first voltage pair including the high voltage and the low voltage, and the second voltage pair including the sub-high voltage and the sub-low voltage; and
a second load circuit configured to generate an output signal based on the first voltage pair and the second voltage pair, the output signal swinging between a second high power voltage and a second low power voltage.

2. The level shifter of claim 1, wherein the first load circuit is coupled to the second input circuit in a cross-coupling structure.

3. The level shifter of claim 2, wherein the first input circuit and the first load circuit perform a pull-down operation, and the second input circuit and the second load circuit perform a pull-up operation.

4. The level shifter of claim 3, wherein a voltage level of the high voltage is lower than a voltage level of the first high power voltage, and a voltage level of the low voltage is higher than a voltage level of the second low power voltage.

5. The level shifter of claim 4, wherein a voltage level of the sub-high voltage is lower than the voltage level of the high voltage by a sub-voltage, and a voltage level of the sub-low voltage is higher than the voltage level of the low voltage by the sub-voltage.

6. The level shifter of claim 5, wherein the first input circuit comprises:
a first PMOS transistor, a source terminal of the first PMOS transistor coupled to the first high power voltage, and a gate terminal of the first PMOS transistor receives the first input signal; and
a second PMOS transistor, a source terminal of the second PMOS transistor coupled to the first high power voltage, and a gate terminal of the second PMOS transistor receives the second input signal, and
wherein the first load circuit comprises:
a first NMOS transistor, a drain terminal and a gate terminal of the first NMOS transistor coupled to a drain terminal of the first PMOS transistor;
a second NMOS transistor, a drain terminal and a gate terminal of the second NMOS transistor coupled to a drain terminal of the second PMOS transistor;
a third NMOS transistor having a drain terminal coupled to a source terminal of the first NMOS transistor, a gate terminal coupled to the drain terminal of the second NMOS transistor, and a source terminal coupled to the second low power voltage; and
a fourth NMOS transistor having a drain terminal coupled to a source terminal of the second NMOS transistor, a gate terminal coupled to the drain terminal of the first NMOS transistor, and a source terminal coupled to the second low power voltage.

7. The level shifter of claim 6, wherein the second input circuit comprises:
- a fifth NMOS transistor, a source terminal of the fifth NMOS transistor coupled to the source terminal of the second NMOS transistor, and a gate terminal of the fifth NMOS transistor coupled to the drain terminal of the first NMOS transistor; and
- a sixth NMOS transistor, a source terminal of the sixth NMOS transistor coupled to the source terminal of the first NMOS transistor, and a gate terminal of the sixth NMOS transistor coupled to the drain terminal of the second NMOS transistor, and wherein the second load circuit comprises:
- a third PMOS transistor, a drain terminal and a gate terminal of the third PMOS transistor coupled to a drain terminal of the fifth NMOS transistor;
- a fourth PMOS transistor, a drain terminal and a gate terminal of the fourth PMOS transistor coupled to a drain terminal of the sixth NMOS transistor;
- a fifth PMOS transistor having a drain terminal coupled to a source terminal of the third PMOS transistor, a gate terminal coupled to the drain terminal of the fourth PMOS transistor, and a source terminal coupled to the second high power voltage; and
- a sixth PMOS transistor having a drain terminal coupled to a source terminal of the fourth PMOS transistor, a gate terminal coupled to the drain terminal of the third PMOS transistor, and a source terminal coupled to the second high power voltage.

8. The level shifter of claim 7, wherein the sub-voltage corresponds to a threshold voltage of the first NMOS transistor and the second NMOS transistor.

9. The level shifter of claim 2, wherein the first input circuit and the first load circuit perform a pull-up operation, and the second input circuit and the second load circuit perform a pull-down operation.

10. The level shifter of claim 9, wherein a voltage level of the high voltage is lower than a voltage level of the second high power voltage, and a voltage level of the low voltage is higher than a voltage level of the first low power voltage.

11. The level shifter of claim 10, wherein a voltage level of the sub-high voltage is lower than the voltage level of the high voltage by a sub-voltage, and a voltage level of the sub-low voltage is higher than the voltage level of the low voltage by the sub-voltage.

12. The level shifter of claim 11, wherein the first input circuit comprises:
- a first NMOS transistor, a source terminal of the first NMOS transistor coupled to the first low power voltage, and a gate terminal of the first NMOS transistor receives the first input signal; and
- a second NMOS transistor, a source terminal of the second NMOS transistor coupled to the first low power voltage, and a gate terminal of the second NMOS transistor receives the second input signal, and wherein the first load circuit comprises:
- a first PMOS transistor, a drain terminal and a gate terminal of the first PMOS transistor coupled to a drain terminal of the first NMOS transistor;
- a second PMOS transistor, a drain terminal and a gate terminal of the second PMOS transistor coupled to a drain terminal of the second NMOS transistor;
- a third PMOS transistor having a drain terminal coupled to a source terminal of the first PMOS transistor, a gate terminal coupled to the drain terminal of the second PMOS transistor, and a source terminal coupled to the second high power voltage; and
- a fourth PMOS transistor having a drain terminal coupled to a source terminal of the second PMOS transistor, a gate terminal coupled to the drain terminal of the first PMOS transistor, and a source terminal coupled to the second high power voltage.

13. The level shifter of claim 12, wherein the second input circuit comprises:
- a fifth PMOS transistor, a source terminal of the fifth PMOS transistor coupled to the source terminal of the second PMOS transistor, and a gate terminal of the fifth PMOS transistor coupled to the drain terminal of the first PMOS transistor; and
- a sixth PMOS transistor, a source terminal of the sixth PMOS transistor coupled to the source terminal of the first PMOS transistor, and a gate terminal of the sixth PMOS transistor coupled to the drain terminal of the second PMOS transistor, and wherein the second load circuit comprises:
- a third NMOS transistor, a drain terminal and a gate terminal of the third NMOS transistor coupled to a drain terminal of the fifth PMOS transistor;
- a fourth NMOS transistor, a drain terminal and a gate terminal of the fourth NMOS transistor coupled to a drain terminal of the sixth PMOS transistor;
- a fifth NMOS transistor having a drain terminal coupled to a source terminal of the third NMOS transistor, a gate terminal coupled to the drain terminal of the fourth NMOS transistor, and a source terminal coupled to the second low power voltage; and
- a sixth NMOS transistor having a drain terminal coupled to a source terminal of the fourth NMOS transistor, a gate terminal coupled to the drain terminal of the third NMOS transistor, and a source terminal coupled to the second low power voltage.

14. The level shifter of claim 13, wherein the sub-voltage corresponds to a threshold voltage of the first PMOS transistor and the second PMOS transistor.

15. A level shifter, comprising:
- a first PMOS transistor, a source terminal of the first PMOS transistor coupled to a first high power voltage, and a gate terminal of the first PMOS transistor receives a first input signal;
- a second PMOS transistor, a source terminal of the second PMOS transistor coupled to the first high power voltage, and a gate terminal of the second PMOS transistor receives a second input signal that is inverted from the first input signal;
- a first NMOS transistor, a drain terminal and a gate terminal of the first NMOS transistor coupled to a drain terminal of the first PMOS transistor;
- a second NMOS transistor, a drain terminal and a gate terminal of the second NMOS transistor coupled to a drain terminal of the second PMOS transistor;
- a third NMOS transistor having a drain terminal coupled to a source terminal of the first NMOS transistor, a gate terminal coupled to the drain terminal of the second NMOS transistor, and a source terminal coupled to a second low power voltage;
- a fourth NMOS transistor having a drain terminal coupled to a source terminal of the second NMOS transistor, a gate terminal coupled to the drain terminal of the first NMOS transistor, and a source terminal coupled to the second low power voltage;
- a fifth NMOS transistor, a source terminal of the fifth NMOS transistor coupled to the source terminal of the second NMOS transistor, and a gate terminal of the fifth NMOS transistor coupled to the drain terminal of the first NMOS transistor;

a sixth NMOS transistor, a source terminal of the sixth NMOS transistor coupled to the source terminal of the first NMOS transistor, and a gate terminal of the sixth NMOS transistor coupled to the drain terminal of the second NMOS transistor;

a third PMOS transistor, a drain terminal and a gate terminal of the third PMOS transistor coupled to a drain terminal of the fifth NMOS transistor;

a fourth PMOS transistor, a drain terminal and a gate terminal of the fourth PMOS transistor coupled to a drain terminal of the sixth NMOS transistor;

a fifth PMOS transistor having a drain terminal coupled to a source terminal of the third PMOS transistor, a gate terminal coupled to the drain terminal of the fourth PMOS transistor, and a source terminal coupled to the second high power voltage; and a sixth PMOS transistor having a drain terminal coupled to a source terminal of the fourth PMOS transistor, a gate terminal coupled to the drain terminal of the third PMOS transistor, and a source terminal coupled to the second high power voltage.

16. The level shifter of claim 15,
wherein the first, second, third, and fourth NMOS transistors comprise a load circuit that generates a high voltage, a sub-high voltage, a low voltage, and a sub-low voltage based on the first input signal and the second input signal, and
wherein the fifth and sixth NMOS transistors comprise an input circuit that receives the high voltage, sub-high voltage, low voltage, and sub-low voltage.

17. The level shifter of claim 16, wherein a voltage level of the high voltage is lower than a voltage level of the second high power voltage, and a voltage level of the low voltage is higher than a voltage level of the first low power voltage.

18. The level shifter of claim 15, wherein the first input signal and the second input signal swing between the first high power voltage and the first low power voltage.

19. A display device, comprising:
a display panel having a plurality of source-lines, a plurality of gate-lines, and a plurality of thin film transistors disposed between the source-lines and the gate-lines,
a source-line driver outputting data voltages to the source lines;
a gate-line driver outputting gate voltages the gate lines and including a level shifter; and
a timing controller controlling the source-line driver and the gate line driver,
wherein the level shifter comprises:
a first NMOS transistor, a source terminal of the first NMOS transistor coupled to a first low power voltage, and a gate terminal of the first NMOS transistor receives a first input signal;

a second NMOS transistor, a source terminal of the second NMOS transistor coupled to the first low power voltage, and a gate terminal of the second NMOS transistor receives a second input signal that is inverted from the first input signal;

a first PMOS transistor, a drain terminal and a gate terminal of the first PMOS transistor coupled to a drain terminal of the first NMOS transistor;

a second PMOS transistor, a drain terminal and a gate terminal of the second PMOS transistor coupled to a drain terminal of the second NMOS transistor;

a third PMOS transistor having a drain terminal coupled to a source terminal of the first PMOS transistor, a gate terminal coupled to the drain terminal of the second PMOS transistor, and a source terminal coupled to a second high power voltage;

a fourth PMOS transistor having a drain terminal coupled to a source terminal of the second PMOS transistor, a gate terminal coupled to the drain terminal of the first PMOS transistor, and a source terminal coupled to the second high power voltage;

a fifth PMOS transistor, a source terminal of the fifth PMOS transistor coupled to the source terminal of the second PMOS transistor, and a gate terminal of the fifth PMOS transistor coupled to the drain terminal of the first PMOS transistor;

a sixth PMOS transistor, a source terminal of the sixth PMOS transistor coupled to the source terminal of the first PMOS transistor, and a gate terminal of the sixth PMOS transistor coupled to the drain terminal of the second PMOS transistor;

a third NMOS transistor, a drain terminal and a gate terminal of the third NMOS transistor coupled to a drain terminal of the fifth PMOS transistor;

a fourth NMOS transistor, a drain terminal and a gate terminal of the fourth NMOS transistor coupled to a drain terminal of the sixth PMOS transistor;

a fifth NMOS transistor having a drain terminal coupled to a source terminal of the third NMOS transistor, a gate terminal coupled to the drain terminal of the fourth NMOS transistor, and a source terminal coupled to a second low power voltage; and a sixth NMOS transistor having a drain terminal coupled to a source terminal of the fourth NMOS transistor, a gate terminal coupled to the drain terminal of the third NMOS transistor, and a source terminal coupled to the second low power voltage.

20. The display device of claim 19, wherein the first input signal and the second input signal swing between the first high power voltage and the first low power voltage.

* * * * *